US 9,293,555 B2

(12) United States Patent
Watanabe

(10) Patent No.: US 9,293,555 B2
(45) Date of Patent: Mar. 22, 2016

(54) SEMICONDUCTOR DEVICE AND MANUFACTURING METHOD OF SAME

(71) Applicant: Masakazu Watanabe, Toyota (JP)

(72) Inventor: Masakazu Watanabe, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 137 days.

(21) Appl. No.: 13/944,316

(22) Filed: Jul. 17, 2013

(65) Prior Publication Data
US 2014/0035110 A1 Feb. 6, 2014

(30) Foreign Application Priority Data

Aug. 3, 2012 (JP) ................................ 2012-173283

(51) Int. Cl.
*H01L 29/51* (2006.01)
*H01L 29/739* (2006.01)
*H01L 29/06* (2006.01)

(52) U.S. Cl.
CPC ............ *H01L 29/511* (2013.01); *H01L 29/063* (2013.01); *H01L 29/7397* (2013.01); *H01L 2924/0002* (2013.01)

(58) Field of Classification Search
CPC . H01L 29/511; H01L 29/063; H01L 29/7397; H01L 21/022; H01L 23/5283
USPC .................................. 257/633, 734, 773–775
See application file for complete search history.

(56) References Cited

U.S. PATENT DOCUMENTS

| 5,260,408 | A | * | 11/1993 | Auman ......................... 528/183 |
| 5,373,191 | A | * | 12/1994 | Usagawa .......... H01L 21/28587 257/192 |
| 5,374,843 | A | * | 12/1994 | Williams et al. ............... 257/492 |
| 2005/0189654 | A1 | * | 9/2005 | Kurokawa et al. ............. 257/758 |
| 2008/0237725 | A1 | * | 10/2008 | Suzuki et al. .................. 257/368 |
| 2008/0246159 | A1 | * | 10/2008 | Lim ....................... G02F 1/1333 257/773 |

(Continued)

FOREIGN PATENT DOCUMENTS

| JP | A-2001-15501 | | 1/2001 | |
| JP | 2004-119415 | * | 4/2004 | ............ H01L 21/822 |

(Continued)

OTHER PUBLICATIONS

Machine translation, Okawa, Japanese Patent Publication No. 2004-119415, translation date: Jan. 3, 2015, JPO & Japio, all pages.*

(Continued)

*Primary Examiner* — Victoria K Hall
(74) *Attorney, Agent, or Firm* — Oliff PLC

(57) ABSTRACT

A semiconductor device includes a semiconductor substrate; an insulating film arranged on the semiconductor substrate; an electrode that contacts a portion of a side surface of the insulating film; a first passivation film that is arranged extending from the electrode to the insulating film, and contacts a surface of the insulating film, and contacts a surface of the electrode; and a second passivation film that is arranged on the first passivation film. A difference between a linear expansion coefficient of the first passivation film and a linear expansion coefficient of the insulating film is smaller than a difference between the linear expansion coefficient of the first passivation film and a linear expansion coefficient of the electrode, and a position where the first passivation film contacts a boundary between the electrode and the insulating film is positioned lower than an upper surface of the insulating film.

2 Claims, 6 Drawing Sheets

(56) References Cited

U.S. PATENT DOCUMENTS

| | | | |
|---|---|---|---|
| 2008/0284006 A1* | 11/2008 | Hong et al. | 257/734 |
| 2009/0086435 A1* | 4/2009 | Suzuki et al. | 361/704 |
| 2009/0115074 A1* | 5/2009 | Hammer et al. | 257/780 |
| 2009/0279276 A1* | 11/2009 | Yoshida et al. | 361/808 |
| 2010/0044847 A1* | 2/2010 | Lee | 257/686 |
| 2010/0263913 A1* | 10/2010 | Daubenspeck et al. | 174/250 |
| 2011/0057326 A1* | 3/2011 | Kai et al. | 257/774 |
| 2011/0062600 A1* | 3/2011 | Ueno et al. | 257/784 |
| 2011/0079907 A1* | 4/2011 | Farooq et al. | 257/751 |
| 2011/0143132 A1* | 6/2011 | Jung et al. | 428/339 |
| 2011/0186988 A1* | 8/2011 | Chen | H01L 23/485 257/737 |
| 2011/0198748 A1* | 8/2011 | Koike | H01L 21/56 257/737 |
| 2011/0220917 A1* | 9/2011 | Hayashi et al. | 257/77 |
| 2011/0230047 A1* | 9/2011 | Marrs | 438/688 |
| 2012/0045904 A1* | 2/2012 | Choi | 438/786 |
| 2012/0120357 A1* | 5/2012 | Jiroku | 349/123 |
| 2012/0217641 A1* | 8/2012 | Chen | H01L 21/76832 257/771 |
| 2013/0299994 A1* | 11/2013 | Park | H01L 21/76883 257/774 |
| 2013/0320522 A1* | 12/2013 | Lai | H01L 24/05 257/737 |
| 2013/0323921 A1* | 12/2013 | Burke | H01L 21/02164 438/589 |
| 2014/0035124 A1* | 2/2014 | Kamijo | 257/734 |
| 2014/0061871 A1* | 3/2014 | Nagasawa | H01L 23/562 257/635 |
| 2015/0008587 A1* | 1/2015 | Lin | H01L 23/49822 257/774 |

FOREIGN PATENT DOCUMENTS

| | | |
|---|---|---|
| JP | A-2004-119415 | 4/2004 |
| JP | A-2005-244031 | 9/2005 |
| JP | A-2008-288594 | 11/2008 |

OTHER PUBLICATIONS

Machine translation, Hong, Japanese Patent Publication No. 2008-288594, translation date: Jan. 3, 2015; JPO & Japio, all pages.*

Machine translation, Kurokawa, Japanese Patent Publication No. 2005-244031, translation date: Jan. 3, 2015, JPO & Japio, all pages.*

Machine translation, Sato, Japanese Patent Publication No. 2001-15501, translation date: Jan. 3, 2015, JPO & Japio, all pages.*

Machine translation, Okawa, Japanese Pat. Pub. No. 2004-119415, translation date: Aug. 13, 2015, Espacenet. all pages.*

* cited by examiner

SEMICONDUCTOR DEVICE AND MANUFACTURING METHOD OF SAME

INCORPORATION BY REFERENCE

The disclosure of Japanese Patent Application No. 2012-173283 filed on Aug. 3, 2012 including the specification, drawings and abstract is incorporated herein by reference in its entirety.

BACKGROUND OF THE INVENTION

1. Field of the Invention

The invention relates to a semiconductor device and a manufacturing method thereof.

2. Description of Related Art

A semiconductor device is provided with a passivation film for protecting a semiconductor element. In this semiconductor device, the passivation film may be formed on a boundary where an insulating film contacts an electrode. For example, the electrode may be formed on the insulating film, and the passivation film may be formed extending from the electrode to the insulating film. In such a case, the passivation film is formed on the boundary where the insulating film contacts the electrode. With a semiconductor device having this kind of structure, a crack may form in the passivation film of the boundary portion where the insulating film contacts the electrode, due to a change in external temperature. That is, a large stress may be applied to the passivation film of the boundary portion, such that cracking occurs, due to thermal stress caused by a difference in linear expansion coefficients of the insulating film and the electrode. Therefore, Japanese Patent Application Publication No. 2004-119415 (JP 2004-119415 A) describes technology for preventing the occurrence of cracking in the passivation film due to a change in temperature.

With the technology described in JP 2004-119415 A, a lead wire is formed by an electrode wire of a lower layer, from among electrode wires of multiple layers. Accordingly, the occurrence of shearing stress in a wire upper portion of the uppermost layer due to thermal stress is reduced, so the occurrence of cracking in the passivation film is inhibited. In addition to this, the orientation of the lead wire that is pulled out from the electrode wires is an orientation that is opposite a corner that is closest to a semiconductor chip peripheral edge. As a result, the occurrence of cracking in the passivation film at the corner with the electrode wires and the like is inhibited.

In JP 2004-119415 A, the lead wire forms the electrode wire of a layer that is lower than the uppermost layer. Also, the lead wire is oriented opposite the closest corner. Therefore, the location where the lead wire is able to be formed ends up being limited, so the degree of freedom in design of the semiconductor device decreases.

SUMMARY OF THE INVENTION

The invention thus provides a semiconductor device, and a manufacturing method thereof, in which the occurrence of cracking in a passivation film at a boundary portion where an insulating film contacts a metal layer is inhibited, without reducing the degree of freedom in design of the semiconductor device.

A first aspect of the invention relates to a semiconductor device includes a semiconductor substrate; an insulating film arranged on the semiconductor substrate; an electrode that contacts a portion of a side surface of the insulating film; a first passivation film that is arranged extending from the electrode to the insulating film, and contacts a surface of the insulating film, and contacts a surface of the electrode; and a second passivation film that is arranged on the first passivation film. A difference between a linear expansion coefficient of the first passivation film and a linear expansion coefficient of the insulating film is smaller than a difference between the linear expansion coefficient of the first passivation film and a linear expansion coefficient of the electrode, and a position where the first passivation film contacts a boundary between the electrode and the insulating film is positioned lower than an upper surface of the insulating film.

According to this aspect, the occurrence of cracking in the first passivation film and a decrease in the degree of freedom in design of the semiconductor device are able to be inhibited.

A second aspect to the invention relates to a semiconductor device manufacturing method includes forming an insulating film on a semiconductor substrate; forming an open portion in the insulating film; forming an electrode in the open portion; forming a first passivation film that contacts a surface of the insulating film and contacts a surface of the electrode, extending from the electrode to the insulating film; and forming a second passivation film on the first passivation film. The insulating film, the first passivation film, and the electrode are formed of material in which a difference between a linear expansion coefficient of the first passivation film and a linear expansion coefficient of the insulating film is smaller than a difference between the linear expansion coefficient of the first passivation film and a linear expansion coefficient of the electrode; and when forming the electrode, the electrode is formed in the open portion of the insulating film such that a portion of a side surface of the open portion of the insulating film is exposed on a surface.

According to this aspect, it is possible to manufacture a semiconductor device in which the occurrence of cracking in the first passivation film at the boundary portion where the insulating film contacts the metal layer is inhibited, while inhibiting a decrease in the degree of freedom in design of the semiconductor device.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
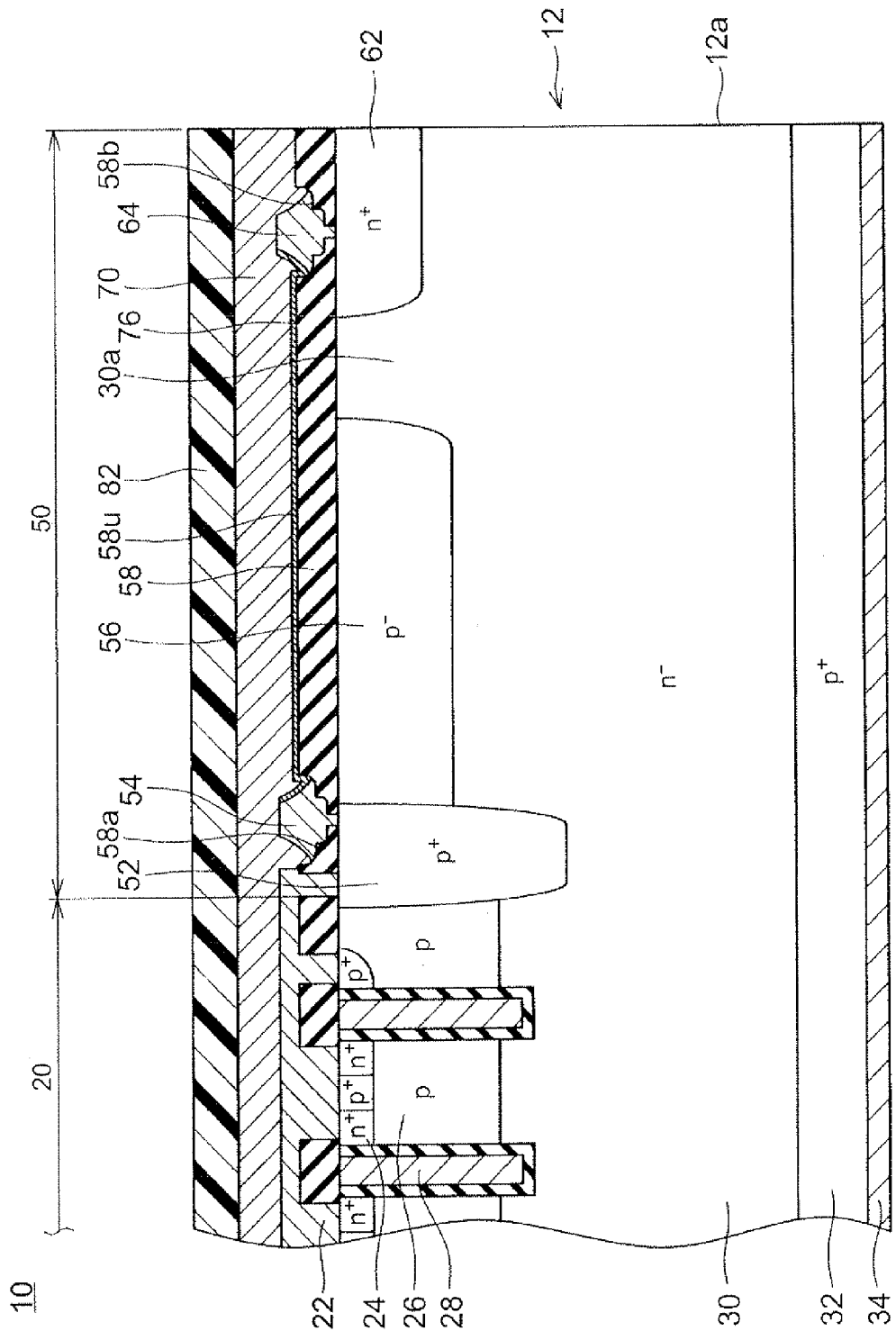
FIG. 1 is a longitudinal sectional view of a semiconductor device of the invention.

Next, example embodiments of the semiconductor device of the invention will be described. FIG. 1 is a longitudinal sectional view of a semiconductor device 10 of the invention. As shown in FIG. 1, the semiconductor device 10 includes a semiconductor substrate 12, and an electrode and an insulating film and the like formed on an upper surface and a lower surface of the semiconductor substrate 12. The semiconductor substrate 12 has an active region 20 and a peripheral, voltage-resistant region 50. An IGBT (Insulated Gate Bipolar Transistor) is formed in the active region 20. The active region 20 is formed in substantially a center portion of the semiconductor substrate 12 when the semiconductor substrate 12 is viewed from the upper surface side. The peripheral voltage-resistant region 50 is a region that mitigates the electric field of the active region 20. The peripheral voltage-resistant region 50 is formed at an outer peripheral portion of the semiconductor substrate 12. More specifically, the peripheral voltage-resistant region 50 is a region that is between the active region 20 and an outer end portion (i.e., an outer periphery) 12a of the semiconductor substrate 12. Therefore, when the semiconductor substrate 12 is viewed from above, the active region 20 is surrounded by the peripheral voltage-resistant region 50.

A trench is formed in an upper surface of the active region 20. The inner surface of the trench is covered by a gate insulating film. A gate electrode 28 is formed in the trench. An emitter electrode 22 is formed on the upper surface of the active region 20. A bus bar, not shown, is solder joined to the emitter electrode 22. A collector electrode 34 is formed on a lower surface of the semiconductor substrate 12. An electrode (for example, the emitter electrode 22, a gate electrode pad (i.e., a pad that is connected to each gate electrode 28), not shown, and another signal extracting electrode) on an upper surface of the semiconductor device 10 is connected to an external conductive member by a brazing filler metal such as solder, or wire bonding, or a conductive paste or the like.

An n-type emitter region 24, a p-type body region 26, an n-type drift region 30, and a p-type collector region 32 are formed in the active region 20. The emitter region 24 is formed in an area exposed on the upper surface of the semiconductor substrate 12. The emitter region 24 contacts a gate insulating film that covers the gate electrode 28. The emitter region 24 is ohmically connected to the emitter electrode 22. The body region 26 is formed next to the emitter region 24 and on the lower side of the emitter region 24. The body region 26 contacts the gate insulating film on the lower side of the emitter region 24. The body region 26 (a so-called body contact region) between two emitter regions 24 has a high p-type impurity concentration, and is ohmically connected to the emitter electrode 22. The drift region 30 is formed on a lower side of the body region 26. The drift region 30 is separated from the emitter region 24 by the body region 26. The drift region 30 contacts the gate insulating film of a lower end portion of the trench. The collector region 32 is formed on a lower side of the drift region 30. The collector region 32 has a high p-type impurity concentration, and is ohmically connected to the collector electrode 34. The IGBT is formed in the active region 20 by these electrodes and semiconductor regions that are described above.

A deep p-type region 52, a RESURF region 56, and an end portion n-type region 62 are formed in the peripheral voltage-resistant region 50. The deep p-type region 52 is positioned at the boundary between the active region 20 and the peripheral voltage-resistant region 50. The deep p-type region 52 is formed in an area exposed on the upper surface of the semiconductor substrate 12. The deep p-type region 52 contacts the body region 26. The deep p-type region 52 is formed deeper than the gate electrode 28 in the active region 20. The deep p-type region 52 contains a high concentration of p-type impurities, and is ohmically connected to an electrode 54 that is formed on the deep p-type region 52. The electrode 54 functions as an example of the metal layer.

The RESURF region 56 is adjacent to the deep p-type region 52. The RESURF region 56 is formed in an area exposed on the upper surface of the semiconductor substrate 12. The RESURF region 56 is formed shallower than the deep p-type region 52. The p-type impurity concentration of the RESURF region 56 is lower than that of the deep p-type region 52. Also, the p-type impurity concentration of the RESURF region 56 is lower than the n-type impurity concentration of the end portion n-type region 62. The end portion n-type region 62 is formed in an area exposed on the end surface 12a of the semiconductor substrate 12, and exposed on the upper surface of the semiconductor substrate 12. The end portion n-type region 62 has a relatively high concentration of n-type impurities, and is ohmically connected to an electrode 64 that is formed on the end portion n-type region 62. The electrode 64 functions as an example of the metal layer. The n-type impurity concentration of the drift region 30 is lower than the p-type impurity concentration of the deep p-type region 52, and the n-type impurity concentration of the end portion n-type region 62. The collector region 32 is formed on a lower side of the drift region 30 in the peripheral voltage-resistant region 50 as well.

An insulating film 58 is formed on the surface of the peripheral voltage-resistant region 50. The insulating film 58 extends from the deep p-type region 52 to the end portion n-type region 62, and is formed on the upper surface of both the RESURF region 56 and the peripheral drift region 30a. Open portions 58a and 58b are formed in the insulating film 58. The opening width of the open portions 58a and 58b (i.e., the opening width in a cross-section shown in FIG. 1) is narrower on the semiconductor substrate 12 side, and widens farther away from the semiconductor substrate 12. The open portions 58a and 58b are arranged apart from each other. More specifically, the open portion 58a is positioned on the deep p-type region 52, and the open portion 58b is positioned on the end portion n-type region 62. The electrode 54 and the electrode 64 are formed in the open portions 58a and 58b, respectively, of the insulating film 58. That is, the electrodes 54 and 64 are formed contacting a side surface of the open portions 58a and 58b. However, the electrodes 54 and 64 do not contact a portion (an upper portion) of the side surface of the open portions 58a and 58b. Also, the electrodes 54 and 64 do not contact an upper surface 58u of the insulating film 58 beyond the side surface of the open portions 58a and 58b. The side surface of the electrodes 54 and 64 includes a first portion that contacts the side surface of the open portions 58a and 58b, and a second portion that extends upward away from the insulating film 58. The second portion of the electrodes 54 and 64 is inclined such that the width of the electrodes 54 and 64 (i.e., the width in the cross-section shown in FIG. 1) gradually becomes narrower away from the semiconductor substrate 12. An upper surface of the electrodes 54 and 64 is parallel to an upper surface of the semiconductor substrate 12. A lower surface of the electrode 54 contacts the deep p-type region 52 through the open portion 58a. A lower surface of the electrode 64 contacts the end portion n-type region 62 through the open portion 58b. The electrode 54 and the electrode 64 are made of aluminum. The type of metal used to form the electrodes is not limited to this.

Figure 2:
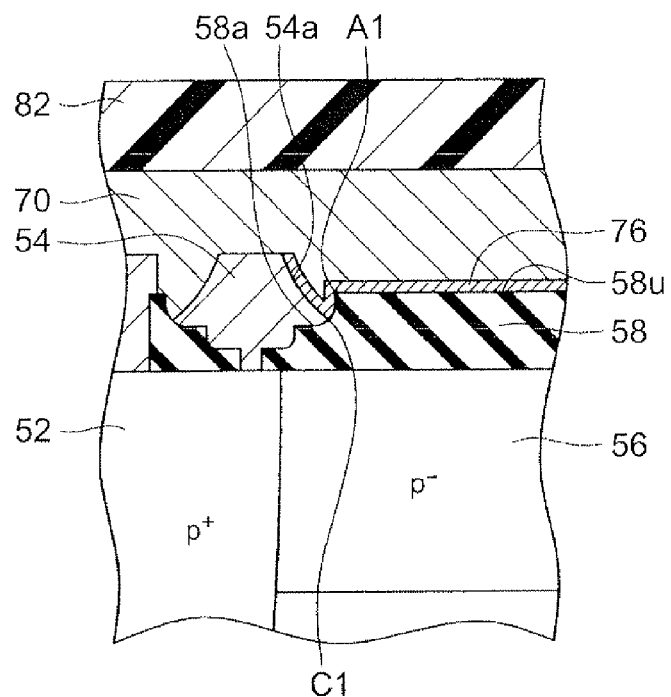
FIG. 2 is a longitudinal sectional view of an area near an electrode in a peripheral voltage-resistant region of the semiconductor device of the invention.

The insulating film 58 is positioned between the electrode 54 and the electrode 64, and a nitride film 76 is formed on this insulating film 58. The nitride film 76 is formed extending between the electrode 54 and the electrode 64. That is, the nitride film 76 is formed on the surface of the insulating film 58 so as to contact the second portion of the side surface on an outer side (i.e., the right side in FIG. 1) of the electrode 54, and contact the second portion on the side surface on an inner side (i.e., the left side in FIG. 1) of the electrode 64. Therefore, the nitride film 76 is formed as one continuous film from the insulating film 58 to the electrode 54 and the electrode 64, on the surface of the peripheral voltage-resistant region 50. Here, the nitride film 76 will be described in more detail with reference to FIG. 2. FIG. 2 is a partial enlarged view of an area near the electrode 54 in FIG. 1. As shown in FIG. 2, a position C1 where the nitride film 76 contacts the boundary between the electrode 54 and the insulating film 58 is positioned lower than the upper surface 58u of the insulating film 58. That is, the electrode 54 does not contact the upper portion of the side surface of the open portion 58a of the insulating film 58. Instead, a depression of which the position C1 is the bottom portion is formed between the electrode 54 and the insulating film 58. In other words, a step (a corner portion) is formed from the position C1 to the upper surface 58u of the insulating film 58, on the insulating film 58. The nitride film 76 is formed so as to contact the position C1 along a second portion 54a of the side surface on the outer side of the electrode 54, and cover the step of the insulating film 58 described above. Although not shown in FIG. 2, the same is also true for the nitride film 76 that covers the second portion of the side surface on the inner side of the electrode 64. The nitride film 76 need only contact at least a portion of the side surface on the outer side of the electrode 54, not the entire side surface on the outer side of the electrode 54. Similarly, the nitride film 76 need only contact at least a portion of the side surface on the inner side of the electrode 64, not the entire side surface on the inner side of the electrode 64. The nitride film 76 functions as one example of the first passivation film. The nitride film 76 may be a semiconductive silicon nitride film (a so-called SInSiN film), for example, but the material that forms the first passivation film is not limited to this.

The semiconductor device 10 will now be described with reference to FIG. 1. A polyimide film 70 is formed on the surface of the electrode 54 and the electrode 64, the surface of the nitride film 76, and the surface of the insulating film 58. The polyimide film 70 also contacts a portion of the upper surface of the emitter electrode 22. That is, the polyimide film 70 is formed as a layer that is continuous with a portion of the surface of the active region 20, and the surface of the peripheral voltage-resistant region 50. The polyimide film 70 functions as one example of the second passivation film. In this example embodiment, the second passivation film is formed by the polyimide film 70, but the material that forms the second passivation film is not limited to this.

The structure described above, in other words, the nitride film 76, contacts the insulating film 58, the electrodes 54 and 64, and the polyimide film 70. The linear expansion coefficients of the nitride film 76 (SiN), the insulating film 58 (SiO$_2$), the electrodes 54 and 64 (aluminum), and the polyimide film 70 (polyimide), are $3\times10^{-6}$ [/K], $0.6\times10^{-6}$ [/K], $24\times10^{-6}$ [/K], and $40\times10^{-6}$ [/K], respectively. That is, the difference between the linear expansion coefficient of the nitride film 76 and the linear expansion coefficient of the insulating film 58 is smaller than the difference between the linear expansion coefficient of the nitride film 76 and the linear expansion coefficient of the electrodes 54 and 64, and the difference between the linear expansion coefficient of the nitride film 76 and the linear expansion coefficient of the polyimide film 70. Also, the linear expansion coefficient of the nitride film 76 is smaller than the linear expansion coefficient of the electrodes 54 and 64, and the linear expansion coefficient of the polyimide film 70.

A resin layer 82 is formed on an upper surface of the polyimide film 70. A polymer layer may also be formed between the polyimide film 70 and the resin layer 82. The polymer layer may be formed of a polyamide, for example. Forming the polymer layer of a polyamide enables the contact between the polymer layer and the resin layer 82 to be improved.

Figure 3:
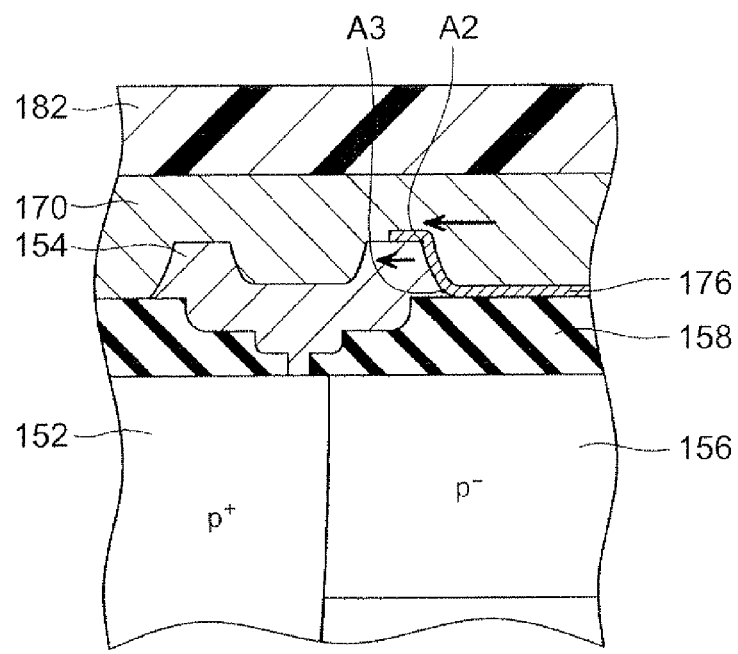
FIG. 3 is a longitudinal sectional view of an area near an electrode of a related semiconductor device at a low temperature.
Figure 4:
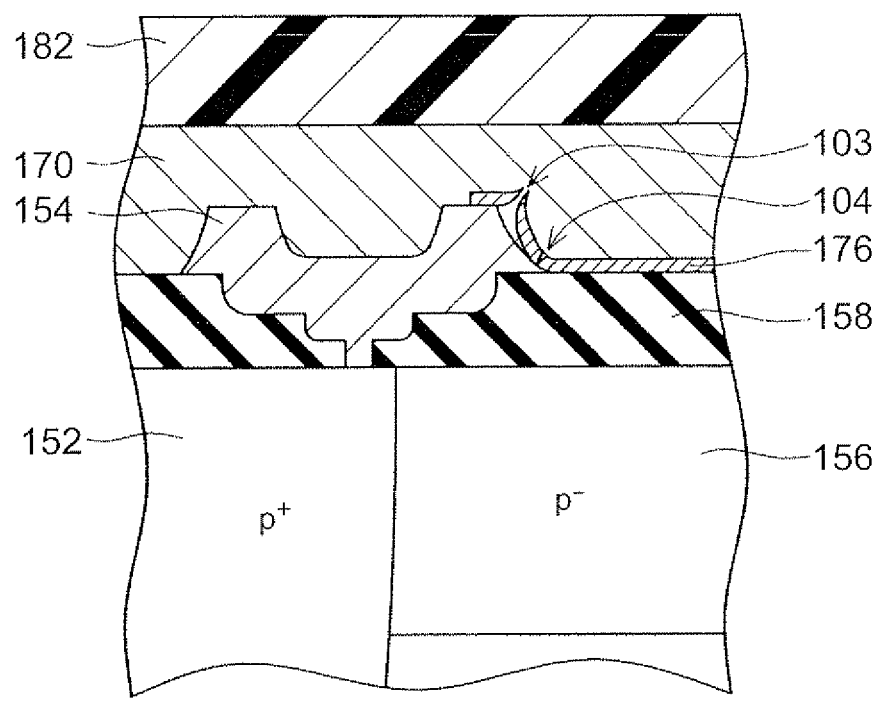
FIG. 4 is a view of a state in which a crack has formed in a nitride film of the semiconductor device in FIG. 3.

Next, the operation and effects of the semiconductor device 10 of the invention will be described referring to a semiconductor device according to related art as a comparative example, with reference to FIGS. 2 to 4. FIG. 3 is a longitudinal sectional view of an area near an electrode of the related semiconductor device at a low temperature. The arrows in FIG. 3 indicate, in frame format, stress generated in each member due to the low temperature. A nitride film 176, an insulating film 158, an electrode 154, a polyimide film 170, and a resin layer 182 are made of the same materials that the nitride film 76, the insulating film 58, the electrode 54, the polyimide film 70, and the resin layer 82 in FIG. 2 are made of, respectively. A deep p-type region 152 and a RESURF region 156 are formed in a peripheral voltage-resistant region. The linear expansion coefficients of the nitride film 176, the insulating film 158, the electrode 154, and the polyimide film 170 are approximately $3\times10^{-6}$ [/K], $0.6\times10^{-6}$ [/K], $24\times10^{-6}$ [/K], and $40\times10^{-6}$ [/K], respectively. That is, the nitride film 176 is surrounded by material (i.e., the electrode 154 and the polyimide film 170) having a comparatively larger linear expansion coefficient than the linear expansion coefficient of the nitride film 176 itself, on the upper surface and the side surface of the electrode 154. Therefore, when the temperature of the semiconductor device is reduced, these materials thermally contract due to the change in temperature, so a strong shear stress such as that indicated by the arrows in FIG. 3 acts on both sides of the nitride film 176. By changing the temperature of the semiconductor device, the electrode 154 and the polyimide film 170 thermally expand and contract repeatedly, so shear stress acts on both sides of the nitride film 176. Therefore, stress concentrates on the nitride film 176 that covers the corner portion A2 and the curved portion A3 shown in FIG. 3, and as a result, a crack 103 and a crack 104 such as those shown in FIG. 4 form.

Here, FIG. 2 is a view of one example embodiment in this specification. As described above, with the technology described in this specification, the position C1 where the nitride film 76 contacts the boundary between the electrode 54 and the insulating film 58 is positioned lower than the upper surface 58u of the insulating film 58. Therefore, the nitride film 76 is formed covering the corner portion A1 of the insulating film 58. Here, as described above, the linear expansion coefficients of the nitride film 76 and the insulating film 58 are relatively close, so even if the nitride film 76 and the insulating film 58 thermally expand and contract repeatedly following changes in temperature, there will be almost no relative displacement between the two. That is, there is almost no thermal stress caused by a difference in the linear expansion coefficients between the insulating film 58 and the nitride film 76. On the other hand, the surface of the nitride film 76 contacts the polyimide film 70 that has a larger linear expansion coefficient than the nitride film 76, so shear stress acts from the polyimide film 70 on the nitride film 76 following a change in temperature. However, because the linear expansion coefficients of the nitride film 76 and the insulating film 58 are relatively close, the stress from the polyimide film 70 is dispersed among the nitride film 76 and the insulating film 58. Therefore, the stress that is applied to the nitride film 76 is significantly reduced compared to when stress from the polyimide film 70 acts only on the nitride film 76. Accordingly, it is possible to inhibit a crack from forming at the corner portion A1.

On the other hand, at the portion where the nitride film 76 contacts the side surface on the outer side of the electrode 54, one surface of the nitride film 76 contacts the electrode 54 that has a linear expansion coefficient larger than that of the nitride film 76 itself, and the other surface of the nitride film 76 contacts the polyimide film 70 that also has a linear expansion coefficient larger than that of the nitride film 76 itself. However, the nitride film 76 does not cover the corner portion of the electrode 54 (i.e., the corner portion formed by the upper surface and the side surface of the electrode 54), so the concentration of stress on the nitride film 76 can be alleviated, thus making it possible to inhibit a crack from forming in the nitride film 76. Also, the nitride film 76 is curved at the position C1, so it is conceivable that stress from the surrounding area (i.e., the electrode 54, the polyimide film 70, and the insulating film 58 against which the nitride film 76 abuts at the position C1) will be applied at this curved portion. However, the curved portion is inside of the depression of which the position C1 is the bottom as described above. The size of the inside of the depression is extremely small compared to the size of the semiconductor device chip, for example. Therefore, the stress that acts on the curved portion of the nitride film 76 is extremely small compared to the stress that acts on the nitride film 76 that abuts against one side of the polyimide film 70 between the electrode 54 and the electrode 64, for example, due to the polyimide film 70 that is formed inside the depression thermally expanding and contracting following a change in temperature. Also, as described above, the insulating film 58 that abuts against the nitride film 76 will generate almost no thermal stress on the nitride film 76 even if the temperature changes. Therefore, even though stress from the electrode 54 is applied to the curved portion of the nitride film 76, the stress that is applied from the surrounding area is dramatically reduced compared to the nitride film 176 of the related art Moreover, near the curved portion (position C1) of the nitride film 76, the electrode 54, the nitride film 76 (electrode side), the nitride film 76 (insulating film side), and the insulating film 58 are arranged in a direction parallel to the surface of the semiconductor substrate 12. As described above, the difference in the linear expansion coefficients of the nitride film 76 and the insulating film 58 is small, so the nitride film 76 and the insulating film 58 expand and contract in a similar manner according to a change in temperature. Thus, thermal stress caused by a difference in the linear expansion coefficients of the nitride film 76 and the electrode 54 is dispersed among the nitride film 76 and the insulating film 58. From this as well, the stress that is applied to the curved portion of the nitride film 76 is able to be alleviated. As a result, cracks are able to be inhibited from forming in the curved portion of the nitride film 76.

With the semiconductor device according to the related art, both sides (i.e., surfaces) of the nitride film 176 are surrounded by a member having a larger linear expansion coefficient than the nitride film 176 itself, at the corner portion A2 and the curved portion A3 where stress from the surrounding area tends to concentrate. Therefore, the members that abut against both sides of the nitride film 176 apply a strong shear stress to the nitride film 176 following a change in temperature, and as a result, cracks may form at the corner portion A2 and the curved portion A3 of the nitride film 176. However, with the semiconductor device 10 of the invention, one side of the nitride film 76 employs a structure that abuts against a member (i.e., the insulating film 58) that has a linear expansion coefficient close to that of the nitride film 76, at the corner portion A1 where stress from the surrounding area tends to concentrate. As a result, even if a member (i.e., the polyimide film 70) that abuts against the other side of the nitride film 76 has a linear expansion coefficient that is larger than that of the nitride film 76, the stress that this member applies to the nitride film 76 is able to be dispersed and received by two layers, i.e., the nitride film 76 and the member that has a linear expansion coefficient close to that of the nitride film 76. Furthermore, with the related art, a comparatively large stress is applied to both sides of the nitride film 176, but with the semiconductor device 10 of the invention, a comparatively large stress is applied to one side of the nitride film 76. With the semiconductor device 10, the stress applied to the nitride film 76 is significantly reduced, so cracking at the corner portion A1 of the nitride film 76 is able to be inhibited. Also, with the semiconductor device of the related art, the height of the position where the nitride film 176 contacts the boundary between the electrode 154 and the insulating film 158 is substantially the same as the height of the upper surface of the insulating film 158, but with the semiconductor device 10 of the invention, the position C1 where the nitride film 76 contacts the boundary between the electrode 54 and the insulating film 58 is positioned lower than the upper surface 58u of the insulating film 58. Accordingly, with the semiconductor device 10 of the invention, a depression is formed between the electrode 54 and the insulating film 58, so stress generated in the nitride film 76 that covers the position C1 (i.e., the curved portion of the nitride film 76) is reduced as described above.

Also, the nitride film prevents movable ions such as Na, Cu, and C1 from entering the semiconductor substrate 12 from the outside. Therefore, as shown in FIG. 1, movable ions are able to be prevented from entering the RESURF region 56 because the nitride film 76 is formed between the electrode 54 and the electrode 64 in the peripheral voltage-resistant region

50. Also, because the nitride film 76 is semiconductive, an induced charge is able to be inhibited from being produced in the surface of the semiconductor substrate 12 by forming the nitride film 76 extending between the electrode 54 and the electrode 64. Therefore, it is possible to suppress a decrease in the voltage-resistance in the peripheral voltage-resistant region.

As described above, the semiconductor device 10 of the invention is able to inhibit the occurrence of cracking in the nitride film 76. Also, only the depression need be formed between the insulating film 58 and the electrodes 54 and 64, so the degree of freedom in design of the semiconductor device is not decreased compared to the related art.

(Manufacturing Method of the Semiconductor Device)

Next, a manufacturing method of the semiconductor device 10 will be described with reference to FIGS. 5 to 9. Although not shown, a semiconductor element structure such as a diffusion layer is formed in the active region 20 of the semiconductor substrate 12. The semiconductor element structure of the active region 20 is formed by a related well-known method, so a description of this forming method will be omitted. In the description below, a method for forming a protective film that is provided on the surface of the peripheral voltage-resistant region 50 of the semiconductor substrate 12 will mainly be described. Also, hereinafter, the manufacturing method of the invention will be described with reference to a drawing showing the area near the electrode 54. The manufacturing method of the invention is also the same for the peripheral voltage-resistant region 50 near the electrode 64. In this example embodiment, the semiconductor device 10 is manufactured by performing an insulating film forming step, an open portion forming step, an electrode forming step, a first passivation film forming step, and a second passivation film forming step, on the semiconductor substrate 12.

(Insulating Film Forming Step and Open Portion Forming Step)

Figure 5:
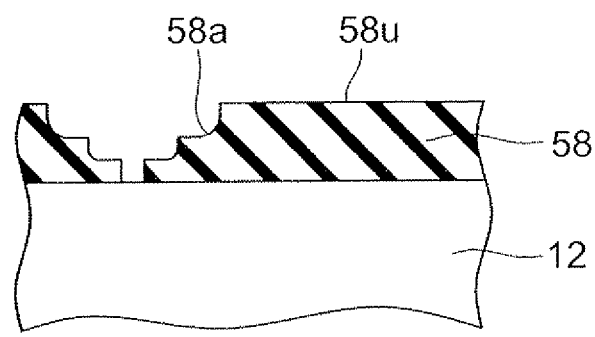
FIG. 5 is a view of a state in which an insulating film formed on a semiconductor substrate has been etched, in a semiconductor device manufacturing method of the invention.

First, as shown in FIG. 5, an insulating film is formed on the entire surface of the semiconductor substrate 12 according to a well-known method. Then wet etching is applied to the thus formed insulating film using a photolithography technique or the like to form the patterned insulating film 58. By applying wet etching, the isotropically-etched open portion 58a is formed in the insulating film 58.

(Electrode Forming Step)

Figure 6:
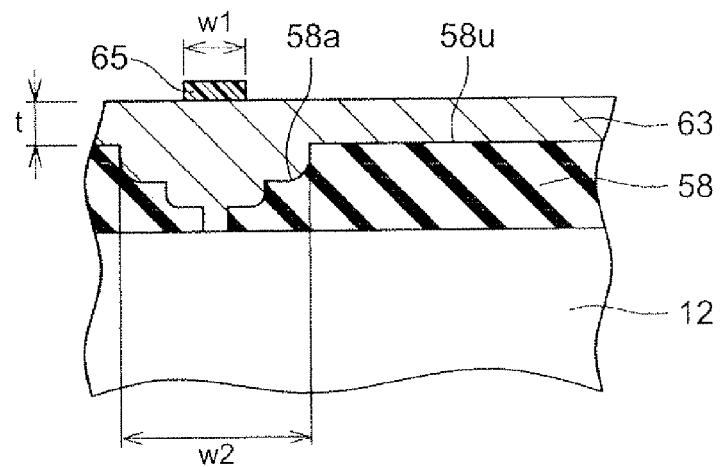
FIG. 6 is a view of a state in which a mask has been formed on a metal layer formed on the insulating film, in the semiconductor device manufacturing method of the invention.
Figure 7:
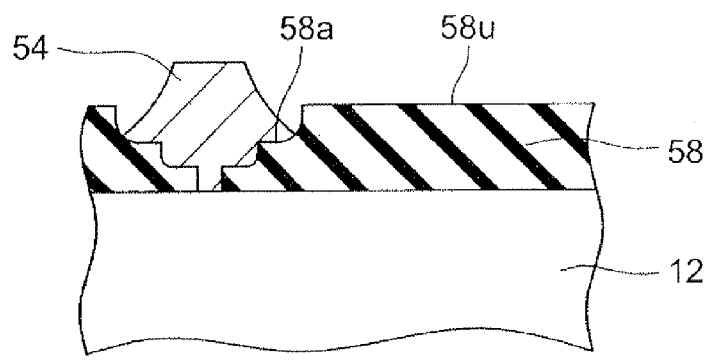
FIG. 7 is a view of a state in which an electrode has been formed by etching the metal layer via the mask, in the semiconductor device manufacturing method of the invention.

Next, as shown in FIG. 6, an aluminum layer 63 is formed by a CVD method or the like on the surface of both the insulating film 58 and the semiconductor substrate 12. A barrier layer may also be formed beforehand between the aluminum layer 63 and the insulating film 58, and between the aluminum layer 63 and the semiconductor substrate 12. Then a mask 65 is formed on the aluminum layer 63 using a photolithography technique or the like. The mask 65 is formed such that a width w1 of the mask 65 becomes narrower than a width w2 of an upper end of the open portion 58a of the insulating film 58. Continuing on, the aluminum layer 63 on which the mask 65 is formed is then wet etched. The amount of wet etching is greater than a film thickness t of the aluminum layer 63 formed on the upper surface of the insulating film 58. Then, the electrode 54, such as that shown in as shown in FIG. 7, is formed by breaking down and removing the mask 65 by ashing. The electrode 54 is formed inside the open portion 58a of the insulating film 58 by adjusting the etching amount and the width w1 of the mask 65 as described above. That is, the electrode 54 will no longer go beyond the open portion 58a of the insulating film 58 and reach the upper surface 58u. The electrode 64, not shown, is also formed by the same method.

(First Passivation Film Forming Step)

Figure 8:
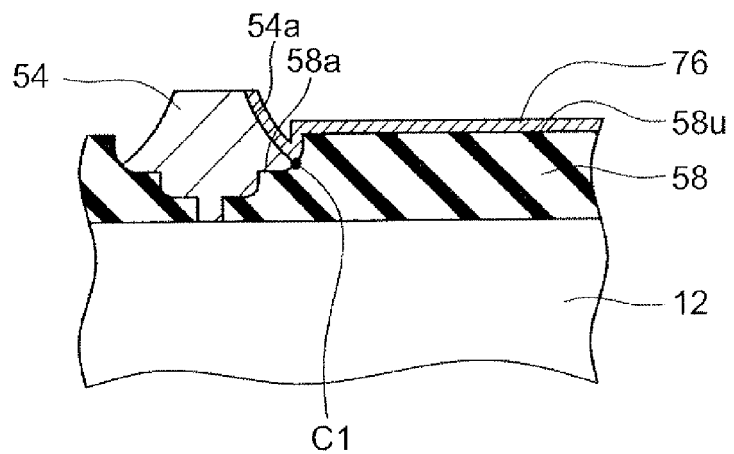
FIG. 8 is a view of a state in which a nitride film has been formed on the insulating film and the electrode, in the semiconductor device manufacturing method of the invention.

Next, as shown in FIG. 8, the nitride film 76 is formed using a plasma CVD method or the like on the surface of both the insulating film 58 and the electrode 54. The method for forming the nitride film 76 is not limited to the plasma CVD method. For example, a radical beam method or the like may also be used. The nitride film 76 formed in this way is formed continuous from the electrode 54 to the insulating film 58, and is in contact with the surface of the insulating film 58 and also contacts the second portion 54a of the side surface of the electrode 54. Also, as is apparent from FIG. 8, the position C1 where the nitride film 76 contacts the boundary between the electrode 54 and the insulating film 58 is positioned lower than the upper surface 58u of the insulating film 58.

(Second Passivation Film Forming Step)

Figure 9:
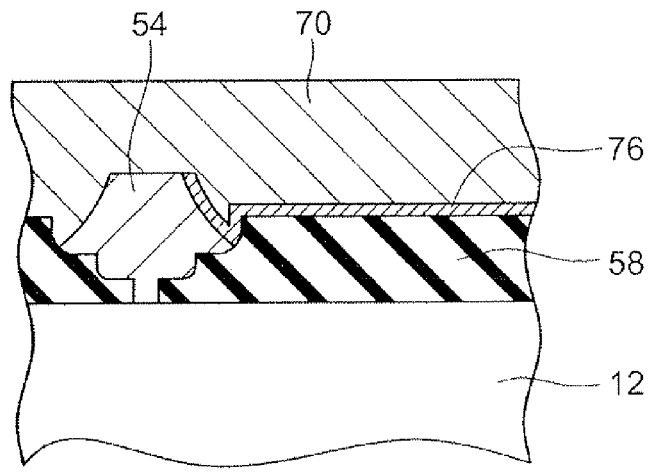
FIG. 9 is a view of a state in which a polyimide film has been formed on the insulating film, the electrode, and the nitride film, in the semiconductor device manufacturing method of the invention.

Continuing on, a polyimide coating film is formed on the surface of the semiconductor substrate 12. More specifically, an organic solvent containing polyimide is applied by a method such as spin coating, and then dried. At this time, the polyimide coating film is formed higher than the height of the electrode 54, such that the step between the electrode 54 and the insulating film 58 is filled (i.e., eliminated). Next, a polyimide baking process is applied, and the polyimide coating film is baked. As a result, the polyimide film 70, such as that shown in FIG. 9, is formed. The polyimide film 70 formed in this way is formed continuous from the nitride film 76 to the insulating film 58 via the electrode 54 (and the electrode 64 and the emitter electrode 22), and contacts the surface of the nitride film 76, the surface of the electrode 54 (and the surfaces of the electrode 64 and the emitter electrode 22), and the surface of the insulating film 58.

The semiconductor device 10 of the invention shown in FIGS. 1 and 2 is able to be manufactured by the manufacturing method described above.

(Semiconductor Device and Manufacturing Method Thereof)

Next, a modified example of the semiconductor device 10 described above and a manufacturing method of the semiconductor device according to this modified example will be described with reference to FIGS. 10 to 14. Members having the same function as in the example embodiment described above will be denoted by like reference characters, and descriptions of these members will be omitted. In the semiconductor device according to the modified example, an opening portion 58a of which an opening width is constant in a vertical direction is formed in the insulating film 58, as shown in FIG. 14. The electrode 54 is formed inside the open portion 58a. The upper surface of the electrode 54 is positioned lower than (i.e., on the semiconductor substrate 12 side of) the upper surface 58u of the insulating film 58. This kind of structure also makes it possible to inhibit the occurrence of cracking in the nitride film 76 that is formed from the electrode 54 to the insulating film 58. Hereinafter, a manufacturing method of the semiconductor device according to the modified example will be described.

(Insulating Film Forming Step and Open Portion Forming Step)

Figure 10:
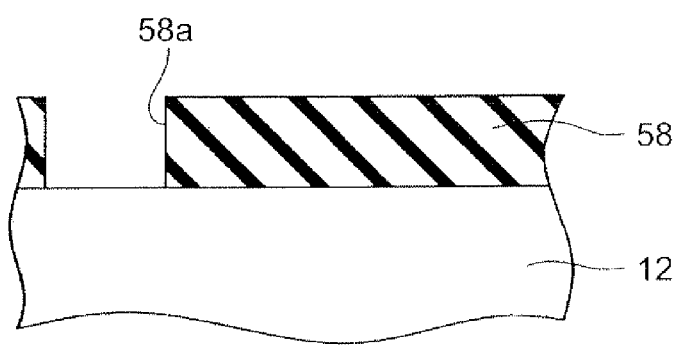
FIG. 10 is a view in which an insulating film formed on the semiconductor substrate has been etched, in a semiconductor device manufacturing method according to another example embodiment of the invention.

First, as shown in FIG. 10, an insulating film is formed on the surface of the semiconductor substrate 12. Next, dry etching is applied to the insulating film to form the patterned insulating film 58. By forming an open portion by dry etching, the open portion 58a having a constant opening width in the film layering direction (i.e., the vertical direction) is formed in the insulating film 58.

(Electrode Forming Step)

Figure 11:
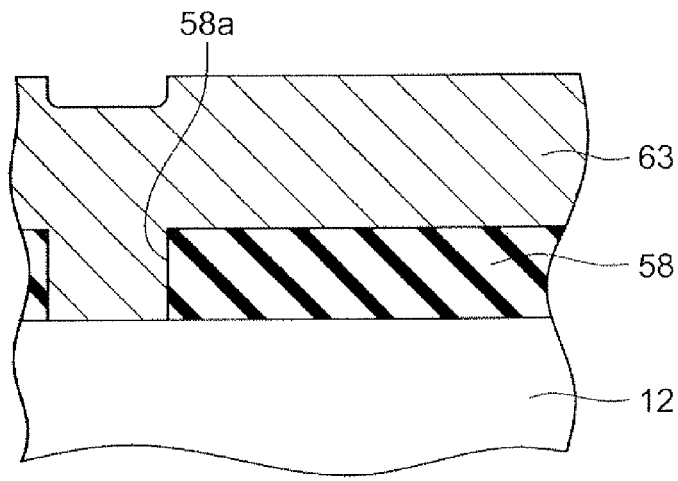
FIG. 11 is a view in which a metal layer has been formed on the insulating film, in the semiconductor device manufacturing method according to the other example embodiment of the invention.
Figure 12:
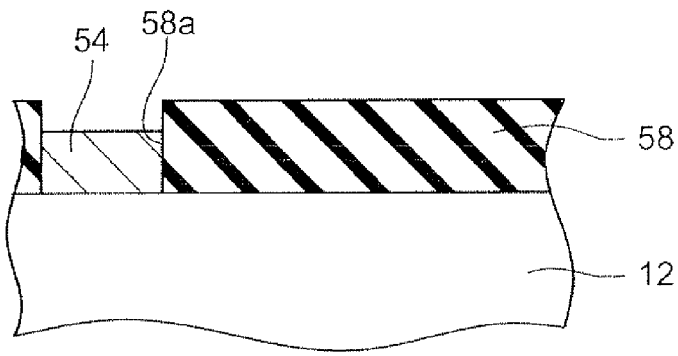
FIG. 12 is a view of a state in which an electrode has been formed by applying etching to the metal layer, in the semiconductor device manufacturing method according to the other example embodiment of the invention.

Next, as shown in FIG. 11, the aluminum layer 63 is formed on the surface of both the insulating film 58 and the semiconductor substrate 12. As shown in FIG. 11, a depression following the open portion 58a formed in the insulating film 58 is formed in the aluminum layer 63. By forming the aluminum layer 63 sufficiently thick, the depth of the depression is shallower than the depth of the open portion 58a of the insulating film 58 (i.e., than the thickness of the insulating film 58). A barrier layer may also be formed beforehand between the aluminum layer 63 and the insulating film 58, and between the aluminum layer 63 and the semiconductor substrate 12. Then the electrode 54, such as that shown in FIG. 12, is formed by applying dry etching to the aluminum layer 63. At this time, an end-point inspection is performed by dry etching, without forming a pattern in the aluminum layer 63. In the modified example, in the open portion forming step, the open portion 58a is formed in the insulating film 58 by dry etching, and then in the electrode forming step, the electrode 54 is formed by performing an end-point inspection by dry etching, without forming a mask on the aluminum layer 63. The electrode 64, not shown, is also formed by the same method.

(First Passivation Film Forming Step)

Figure 13:
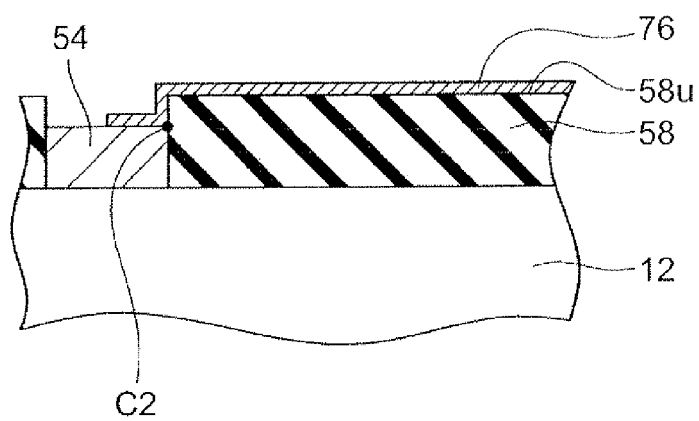
FIG. 13 is a view of a state in which a nitride film has been formed on the insulating film and the electrode, in the semiconductor device manufacturing method according to the other example embodiment of the invention.
Figure 14:
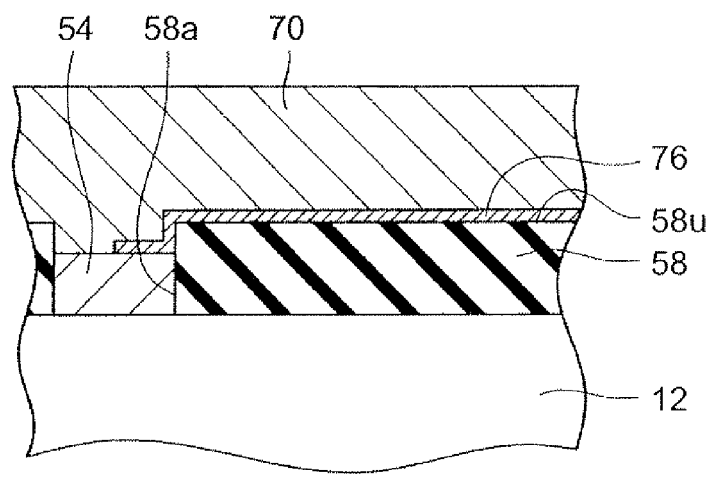
FIG. 14 is a view of a state in which a polyimide film has been formed on the insulating film, the electrode, and the nitride film, in the semiconductor device manufacturing method according to the other example embodiment of the invention.

Next, as shown in FIG. 13, the nitride film 76 is formed on the surface of both the insulating film 58 and the electrode 54. The nitride film 76 formed in this way is formed continuous from the electrode 54 to the insulating film 58, and contacts the surface of the insulating film 58, and is also contacting at least a portion of the surface of the electrode 54. Also, the position C2 where the nitride film 76 contacts the boundary between the electrode 54 and the insulating film 58 is positioned lower than the upper surface 58u of the insulating film 58.

(Second Passivation Film Forming Step)

Continuing on, the polyimide film 70 is formed on the surface of the semiconductor substrate 12, as shown in FIG. 14. The polyimide film 70 formed in this way is formed continuous from the electrode 54 (and the electrode 64 and the emitter electrode 22) to the insulating film 58 via the nitride film 76, and contacts the surface of the electrode 54 (and the surfaces of the electrode 64 and the emitter electrode 22), the surface of the nitride film 76, and the surface of the insulating film 58.

The manufacturing method described above makes it possible to manufacture a semiconductor device in which the occurrence of cracking in the nitride film 76 is able to be inhibited.

With the manufacturing methods described above, the nitride film 76 is formed after forming the electrode 54 and the electrode 64 that are made of aluminum, so corrosion of the electrodes 54 and 64 is able to be reduced. Also, the accumulation rate is able to be increased by dry etching. That is, when the aluminum film is formed after forming the nitride film, and then dry etching is applied, chlorine in the etching gas reacts with hydrogen from the nitride film, and as a result, the aluminum may corrode. With the manufacturing method of the example embodiment, the nitride film is formed after the aluminum film is formed, so the problem of the aluminum film corroding as described above is eliminated.

Hereinafter, example embodiments of the technology described in this specification have been described in detail, but these are no more than examples. The semiconductor device and semiconductor device manufacturing method described in this specification also include various modifications of the example embodiments described above.

For example, in the example embodiment, the nitride film 76 is formed by a semiconductive silicon nitride film (SInSiN film), but the nitride film 76 may also be a two-layered structure having a silicon nitride film (SiN) on an upper surface of a semiconductive silicon nitride film (SInSiN film). In this case, the silicon nitride film (SiN) that is the film of the upper layer of the nitride film 76 serves to insulate, as well as to inhibit movable ions from entering from the outside, while the semiconductive silicon nitride film (SInSiN film) that is the film of the lower layer of the nitride film 76 inhibits an induced charge from being produced in the substrate surface by using its semiconductive property. That is, movable ions from the outside are able to be reliably inhibited from entering the RESURF region 56 by this kind of passivation film being formed between the electrode 54 and the electrode 64 of the peripheral voltage-resistant region 50. As is evident from the function of the nitride film 76 described above, one end of the nitride film 76 may be connected to the electrode 54, and the other end of the nitride film 76 may be connected to the electrode 64.

Also, as described above, the polymer layer having a polyamide may be formed between the polyimide film 70 and the resin layer 82. The contact between the polyamide and the resin is greater than the contact between the polyimide and the resin, so the contact between the members is able to be increased by interposing the polymer layer. The linear expansion coefficient of the polyamide is approximately $80 \times 10^{-6}$ [/K], so by forming the polymer layer with the polyamide, even greater stress is applied to the nitride film following a change in temperature. However, employing this structure makes it possible to inhibit the occurrence of cracking in the nitride film.

Further, in the example embodiment, the electrode 54 and the electrode 64 are electrodes of the uppermost layer, but in a semiconductor device having a multilayer wiring structure, the structure according to the invention may be formed on a layer other than the uppermost layer. Also, in the example embodiment, an IGBT is formed in the active region 20 of the semiconductor device 10, but another semiconductor element may also be formed in the active region 20. For example, a MOSFET or a diode or the like may also be formed. Further, in the example embodiment, the RESURF region 56 is formed in the peripheral voltage-resistant region 50, but the peripheral voltage-resistant region formed on the semiconductor substrate is not limited to the RESURF region 56. For example, another structure such as an FLR (Field Limiting Ring) structure or a field plate structure, or an EQR (Equipotential Ring) or the like may be formed instead of the RESURF region 56.

In the semiconductor device 10 of the invention, two of the electrodes 54 and 64 may be arranged apart from each other, the insulating film 58 may be positioned between the two electrodes 54 and 64, and the first passivation film 76 may be positioned between the two electrodes 54 and 64. As a result, the occurrence of cracking in the first passivation film 76 is able to be inhibited, and movable ions are able to be appropriately inhibited from entering the insulating film 58 positioned between the two electrodes 54 and 64. Accordingly, a change in the characteristics of the semiconductor device 10 due to the effect of the movable ions is able to be inhibited.

In the semiconductor device 10 of the invention, the first passivation film 76 may be semiconductive. As a result, a charge generated by the movable ions is able to flow to the electrodes 54 and 64 via the first passivation film 76. Also, a change in the characteristics of the semiconductor device 10 due to the effect of the movable ions is able to be inhibited.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device manufacturing method comprising:
   forming an insulating film on a semiconductor substrate;
   forming an open portion in the insulating film;
   forming an electrode in the open portion;
   forming a first passivation film that contacts a surface of the insulating film and contacts a surface of the electrode, extending from the electrode to the insulating film, the first passivation film being arranged on the electrode and the insulating film; and
   forming a second passivation film on the first passivation film, the second passivation film being arranged on the first passivation film and directly on an entire upper surface of the electrode, wherein
   the insulating film, the first passivation film, and the electrode are formed of material in which a difference between a linear expansion coefficient of the first passivation film and a linear expansion coefficient of the insulating film is smaller than a difference between the linear expansion coefficient of the first passivation film and a linear expansion coefficient of the electrode,
   when forming the electrode, the electrode is formed in the open portion of the insulating film such that a portion of a side surface of the open portion of the insulating film is exposed on a surface,
   the linear expansion coefficient of the first passivation film is larger than the linear expansion coefficient of the insulating film, and the linear expansion coefficient of the first passivation film is smaller than the linear expansion coefficient of the electrode,
   a linear expansion coefficient of the second passivation film is larger than the linear expansion coefficient of the first passivation film, and
   the difference between the linear expansion coefficient of the first passivation film and the linear expansion coefficient of the insulating film is smaller than a difference between the linear expansion coefficient of the first passivation film and the linear expansion coefficient of the second passivation film.

2. A semiconductor device comprising:
   a semiconductor substrate;
   an insulating film arranged on the semiconductor substrate;
   an electrode that contacts a portion of a side surface of the insulating film;
   a first passivation film that is arranged extending from the electrode to the insulating film, and contacts a surface of the insulating film, and contacts a surface of the electrode; and
   a second passivation film that is arranged on the first passivation film and directly on an entire upper surface of the electrode, wherein
   a difference between a linear expansion coefficient of the first passivation film and a linear expansion coefficient of the insulating film is smaller than a difference between the linear expansion coefficient of the first passivation film and a linear expansion coefficient of the electrode,
   a position where the first passivation film contacts a boundary between the electrode and the insulating film is positioned lower than an upper surface of the insulating film,
   a side surface of the electrode contacts the side surface of the insulating film and extends upward away from the side surface of the insulating film, and
   the first passivation film is arranged on the side surface of the insulating film and the side surface of the electrode facing the side surface of the insulating film.

* * * * *